United States Patent [19]
Park et al.

[11] Patent Number: 5,591,670
[45] Date of Patent: Jan. 7, 1997

[54] METHOD OF MANUFACTURING A SEMICONDUCTOR DEVICE HAVING SELF ALIGNED CONTACT HOLE

[75] Inventors: Won-mo Park, Seoul; Jung-hyun Shin; Young-hun Park, both of Suwon, all of Rep. of Korea

[73] Assignee: Samsung Electronics Co., Ltd., Suwon, Rep. of Korea

[21] Appl. No.: 465,103

[22] Filed: Jun. 5, 1995

Related U.S. Application Data

[62] Division of Ser. No. 209,475, Mar. 14, 1994, Pat. No. 5,502,336.

[30] Foreign Application Priority Data

Mar. 13, 1993 [KR] Rep. of Korea .................. 93-3842

[51] Int. Cl.$^6$ .................................................. H01L 21/44
[52] U.S. Cl. ........................... 437/187; 437/228; 437/40; 156/656.1; 156/657.1
[58] Field of Search ................................. 437/187, 186, 437/191, 193, 195, 40 GS, 41 GS, 947, 981, 228; 148/DIG. 15; 156/653.1, 656.1, 657.1

[56] References Cited

U.S. PATENT DOCUMENTS

| | | | |
|---|---|---|---|
| 4,234,362 | 11/1980 | Riseman | 437/186 |
| 4,419,810 | 12/1983 | Riseman | 437/200 |
| 5,302,536 | 4/1994 | Josquin | 437/41 GS |
| 5,403,435 | 4/1995 | Cathey et al. | 156/643.1 |

*Primary Examiner*—George Fourson
*Assistant Examiner*—C. Everhart
*Attorney, Agent, or Firm*—Cushman Darby & Cushman, IP Group of Pillsbury Madison & Sutro LLP

[57] ABSTRACT

A highly integrated semiconductor device and method for manufacturing the same are disclosed. The device has a self-aligned contact structure for increasing a contact margin upon forming a self-aligned buried contact hole. An oxide film of an upper portion of a gate electrode is chamfered in order to form a self-aligned buried contact hole. Therefore, a self-aligned contact hole can be formed without enhancing the step, and as a result, the step between the cell and the peripheral portion of the cell can be reduced.

5 Claims, 3 Drawing Sheets

5,591,670

METHOD OF MANUFACTURING A SEMICONDUCTOR DEVICE HAVING SELF ALIGNED CONTACT HOLE

This is a divisional of Ser. No. 07/209,475 filed Mar. 14, 1994, now U.S. Pat. No. 5,502,336.

BACKGROUND OF THE INVENTION

1. Field of the Invention

The present invention relates to a semiconductor device and manufacturing method thereof, and more particularly, to a method for forming a self-aligned buried contact hole which can increase the contact margin between a gate electrode and a pad electrode.

2. Description of Related Art

For highly integrated semiconductor devices, such as DRAMs, knowledge of insulating film material properties, lithography, cell structure and new wiring materials is required. In a 64 Mega-bit DRAM, the contact hole area must be reduced according to the reduction of the cell size.

A typical 64 Mega-bit DRAM device has a design rule of approximately 0.3 μm to 0.4 μm, even though the contact hole is formed into the general feature size, i.e., 0.5 μm. The peripheral structure, that is, a gate electrode or a bit line, is frequently exposed as a result of a mis-aligned mask. As a result, the gate electrode contacts a storage electrode and a bit line contacts a storage electrode contact, which greatly reduces the reliability of the DRAM.

Several methods have been proposed for reliably minimizing contact hole area without exposing the peripheral structure caused by a mis-aligned mask. One such method calls for forming a self-aligned contact hole.

In a method for forming a self-aligned contact hole, a step of forming the peripheral structure is used to obtain a contact hole without using a mask. The hole size depends on the height of the peripheral structure, thickness of the insulating material where the contact hole is formed, and the etching method. Therefore, forming a self-aligned contact hole is a method suitable for realizing a highly-integrated semiconductor device.

In general, the gate electrodes of the semiconductor device consist of a gate oxide film, polycrystalline silicon and high temperature oxide film. In order to form a self-aligned contact hole, capping oxide film having sufficient thickness is deposited to complement the etching margin when the contact hole is formed in the edge portion of the gate electrode. Thus, a high-step gate electrode can be produced.

FIG. 1 shows an embodiment of a contact hole of the conventional semiconductor memory device formed by the self-aligned method described above. Gate oxide film 11 is formed on a semiconductor substrate 100. Then, a polycrystalline silicon 12 and an insulating oxide film 13 are deposited, and a gate electrode 101(12, 13) is formed by a photo-etching process. Then, a high temperature oxide film 14 is deposited all over the substrate. A photoresist 15 is deposited and a self-aligned buried contact hole is formed by a photo-etching process. Accordingly, when the thickness of oxide films 13 and 14 deposited all over the gate electrode is not sufficient, the edge of the gate electrode is etched faster than the etching for forming the contact hole is performed. As a result, the edge of the gate electrode is exposed inside of the contact hole.

FIG. 2 shows another embodiment of a contact hole of the conventional semiconductor memory device formed by a self-aligned method described above. A gate oxide film 21 is formed on a semiconductor substrate 200. Then, a polycrystalline silicon 22 and a capping oxide film (insulating oxide film) 23 are deposited, and capping oxide film 23 is etched by a photo-etching process. Polycrystalline silicon 22 is isotropically etched, to thereby form a gate electrode 201 (22, 23). A high temperature oxide film 24 is deposited all over the substrate and a photoresist 25 is deposited. Then, a self-aligned buried contact hole is formed by a photo-etching process. Controlling the hole size is difficult when polycrystalline silicon 22 is isotropically etched, and the surface resistance of polycrystalline silicon 22 is increased. As a result, it is difficult to achieve a highly integrated semiconductor device using this method.

SUMMARY OF THE INVENTION

It is an object of the present invention to provide a highly integrated semiconductor device having a self-aligned contact structure with an increased contact margin when a self-aligned buried contact hole is formed.

It is another object of the present invention to provide a method for manufacturing a highly integrated semiconductor device having a self-aligned contact structure in which the contact margin of a self-aligned buried contact hole is increased.

According to the present invention, the thickness of the oxide film of the upper portion of a gate electrode can be made small in order to form a self-aligned buried contact hole. As a result, the self-aligned buried contact hole can be formed without enhancing the step between a cell region and the peripheral region around the cell. The step can be reduced, to thereby make the photo-etching process easier.

In addition, when the gate electrode formed by a polycrystalline silicon is etched using a wet or dry method, the critical dimension of a polycrystalline silicon used for the gate electrode can be controlled and the increase of surface resistance can be minimized.

Thus, according to the present invention, a self-aligned buried contact hole can be formed without the need to enhance a step by controlling the thickness of the oxide film of the upper portion of the gate electrode, i.e. the second polysilicon pattern.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1:
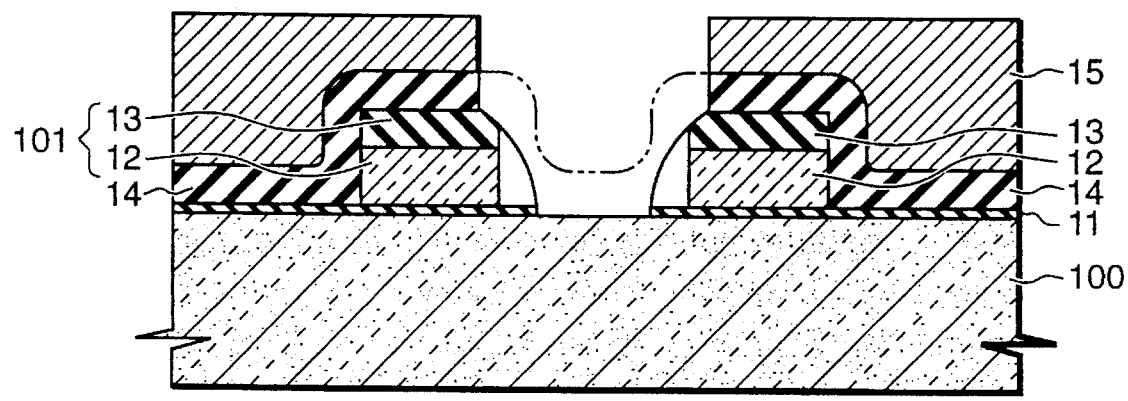
FIG. 1 is a sectional view showing an embodiment of a contact hole of a conventional semiconductor device.
Figure 2:
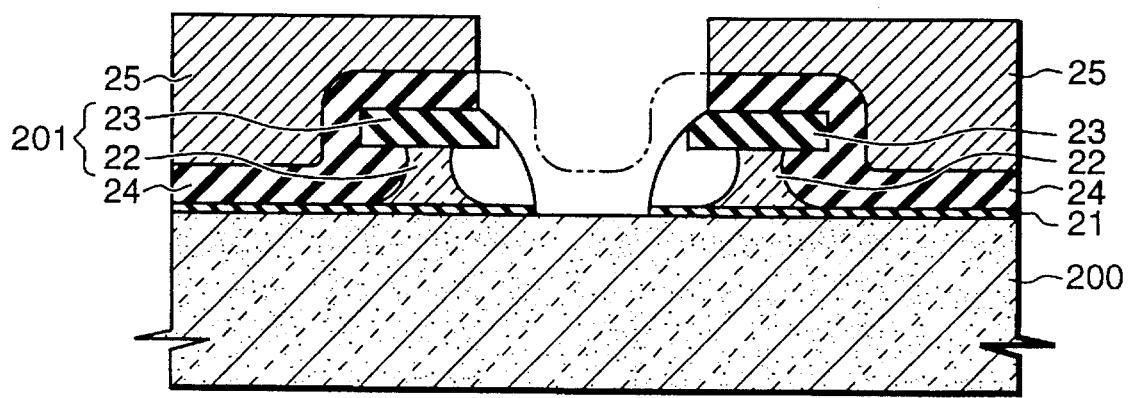
FIG. 2 is a sectional view showing another embodiment of a contact hole of a conventional semiconductor device.
Figure 3:
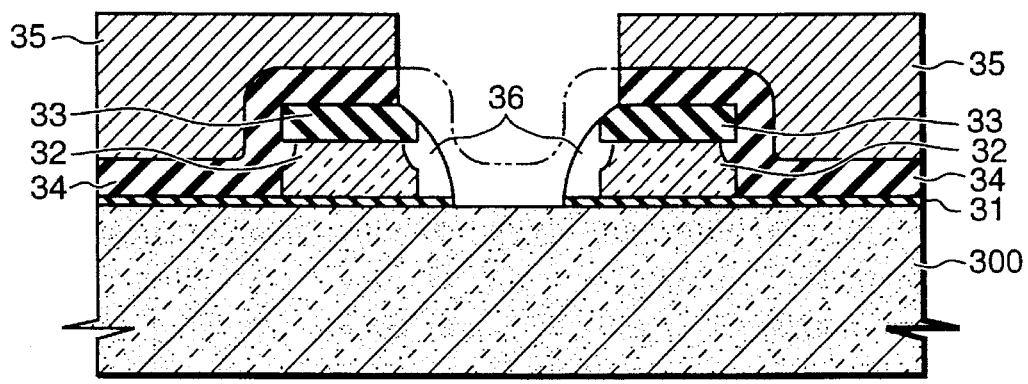
FIG. 3 is a sectional view illustrating a method for forming a contact hole of a semiconductor device according to the present invention.

FIG. 3 is a sectional view illustrating a method for forming a contact hole of a semiconductor device according to the present invention.

First, a gate oxide film 31 is formed on a semiconductor substrate 300. Then, a polycrystalline silicon film 32 and a capping oxide film 33, such as high temperature oxide(HTO) film, are deposited on gate oxide film 31. Then the photoresists are deposited, and the capping oxide film 33 is anisotropically etched using a photoresist pattern (not shown) formed by the photo-etching process. Then, the photoresist pattern is removed, and part of the upper end of polycrystalline silicon film 32 is removed by an isotropic etching using the etched capping oxide film 33 as a mask. Then, the remaining polycrystalline silicon film 32 is anisotropically etched using capping oxide film 33 as a mask, to thereby form a gate electrode 32.

Then, a high temperature oxide film 34 is deposited and photoresist pattern 35 is formed on high temperature oxide film 34. High temperature oxide film 34 and gate oxide film 31 are partially etched using photoresist pattern 35 as an etching mask. As a result, a spacer 36 remains in the side of the gate electrode, thereby forming a contact hole.

Accordingly, the edge of the gate electrode 32 is removed by an isotropic etching process. Therefore, an etching margin of the second high temperature oxide film 34 increases in the weak edge portion when the contact hole is formed. As a result, a reliable self-aligned buried contact hole can be formed.

Figure 4:
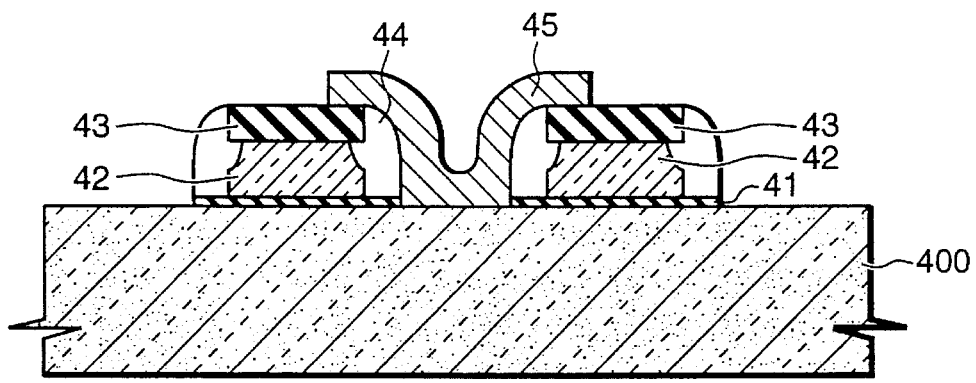
FIG. 4 is a sectional view showing a contact hole of a semiconductor device according to the present invention.

FIG. 4 is a sectional view showing a first embodiment of a contact hole of a semiconductor device according to the present invention.

First, according to the method, a gate oxide film 41 is formed on semiconductor substrate 400 at a thickness of approximately 80 Å to 300 Å. Then, a polycrystalline silicon film 42 is deposited on gate oxide film 41 at a thickness of 1,000 Å to 3,000 Å. Then, n-type impurities are introduced into polycrystalline silicon film 42, and a capping oxide film 43, such as high temperature oxide film, is deposited on the upper portion of polycrystalline silicon film 42 at a thickness of 1,000 Å to 3,000 Å. Then, a photoresist (not shown) is deposited, and the high temperature oxide film is anisotropically etched by applying a photoresist pattern formed by a photo-etching process to form a contact hole. The photoresist is removed, and part of the upper end of polycrystalline silicon film 42 is removed by an amount of 300 Å to 1,000 Å. This may be achieved by by an isotropic etching using the etched high temperature oxide film pattern 43 as a mask and using a wet etchant of polycrystalline silicon. Sequentially, a gate electrode is formed by performing anisotropic etching according to methods such as a reactive ion etching, or an electronic cyclotron resonance on the remaining polycrystalline silicon film, using the high temperature oxide film as a mask.

The gate electrode may also be formed as follows. First, the polycrystalline silicon film is isotropically etched and the photoresist pattern is removed. Then the polycrystalline silicon film is anisotropically and sequentially etched to thereby form a gate electrode. In addition, the polycrystalline silicon film may be serially isotropically and anisotropically etched using the photoresist pattern. Then, the photoresist pattern is removed, to thereby form a gate electrode.

Then, high temperature oxide film is deposited at a thickness of 1,500 Å to 2,500 Å, and a spacer 44 is formed on the sidewall of the gate electrode by a photo-etching process, to thereby form a self-aligned buried contact hole. Then, a polycrystalline silicon is deposited. Then, a pad electrode 45 is formed by photo-etching the polycrystalline silicon, to thereby form an electrode.

FIGS. 5 to 8 are sectional views showing a second embodiment of the present invention and illustrating a method for forming a contact hole of a semiconductor device according to the present invention.

Figure 5:
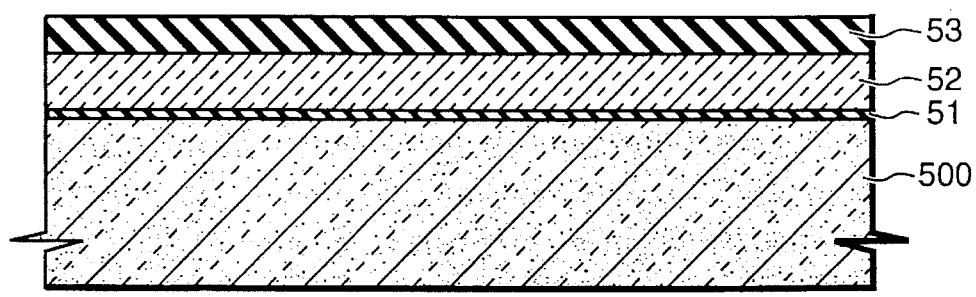
FIGS. 5 to 8 are sectional views showing an embodiment of a method for forming a contact hole of a semiconductor device according to the present invention.

First, referring to FIG. 5, a gate oxide film 51 is formed on a semiconductor substrate 500 and has a thickness of 80 Å to 300 Å. Then, a polycrystalline silicon film 52 having a thickness of 1,000 Å to 3,000 Å is deposited on a gate oxide film 51. Then, n-type impurities are introduced on the polycrystalline silicon film, and a capping oxide film 53 is deposited at a thickness of 1,000 Å to 2,000 Å.

Figure 6:
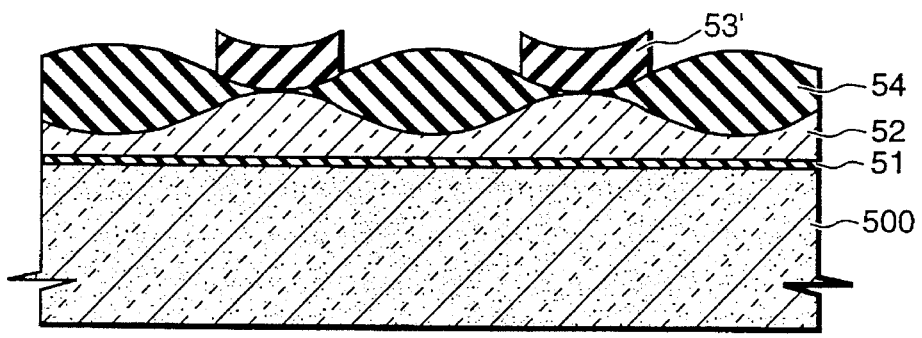

Then, referring to FIG. 6, after a photoresist is deposited, capping oxide film 53, which exists in the region where the contact hole is formed, is removed by applying a photoresist pattern (not shown) formed by a photo-etching process which begins to form the contact hole. Then, the photoresist pattern is removed, and the upper end of polycrystalline silicon film 52 is oxidized using the above etched capping oxide film 53' as a mask. Also, an oxide film 54 having a thickness of 500 Å to 2,000 Å is formed.

Figure 7:
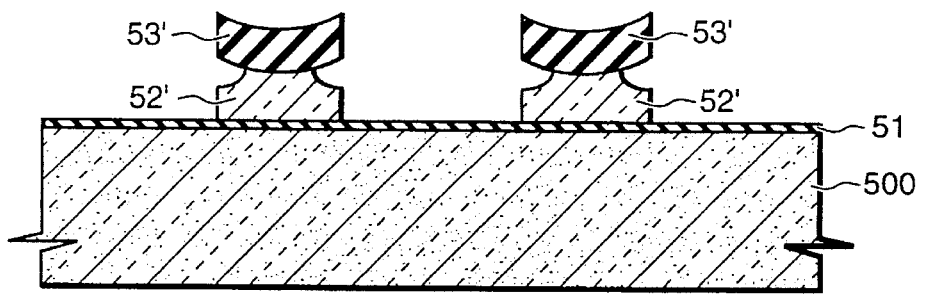

Referring to FIG. 7, oxide film 54 of the upper end of polycrystalline silicon film 52 is removed by a wet etching process. Then, the remaining polycrystalline silicon film 52 is etched using capping oxide film pattern 53' as an etching mask, to thereby form gate electrodes 52'. Chamfer-shaped gate electrode 52' is formed by an isotropical etching using a wet etchant of polycrystalline silicon or dry etching.

Figure 8:
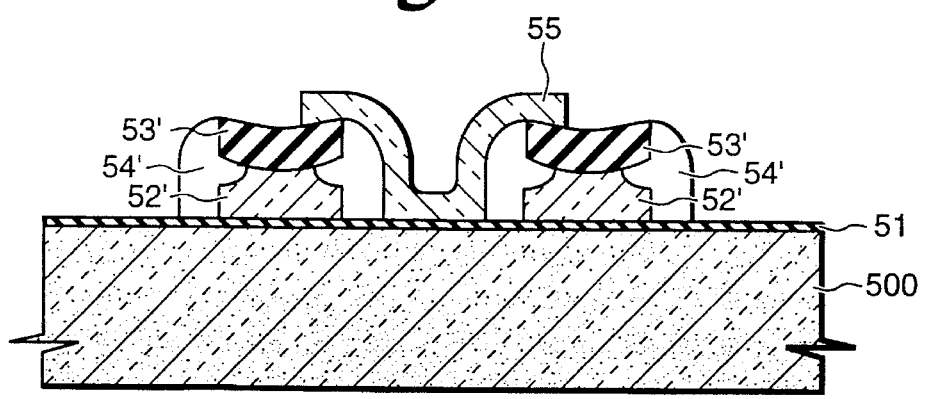

Referring to FIG. 8, a high temperature oxide film having a thickness of 1,500 Å to 2,500 Å is deposited on the resultant structure where the gate electrode is formed. A spacer 54' is formed on the sidewall of a gate electrode by a photo-etching process, to thereby form a self-aligned buried contact hole. Then, a polycrystalline silicon film is deposited and etched by a photo-etching process to form a pad electrode 55. As a result, pad electrode 55 is formed.

According to the first and second embodiments, the pad electrode is connected to the substrate. But, the pad electrode can be connected to a low conductive film, such as polycrystalline silicon film.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A method for forming a semiconductor device comprising the steps of:

sequentially forming a first insulating film, a first conductive film and a second insulating film on a semiconductor substrate;

forming a second insulating film pattern by partially etching said second insulating film;

oxidizing said first conductive film to form an oxide film, using said second insulating film pattern as a mask;

removing said oxide film formed on said first conductive film using a wet etching process;

forming a first conductive film pattern having a chamfer-shaped upper edge, by etching portions of said first conductive film remaining on said first insulating film, using said second insulating film pattern as a mask;

forming a third insulating film on said semiconductor substrate;

forming a contact hole and a spacer on the sides of said second insulating film pattern and said conductive film pattern, by partially etching said third insulating film and said first insulating film; and forming a second conductive film pattern buried in said contact hole.

2. The method of claim 1, wherein the chamfer-shaped upper edge of said first conductive film pattern is formed by an isotropical etching using a wet etchant of polycrystalline silicon.

3. The method of claim 1, wherein the chamfer-shaped upper edge of said first conductive film pattern is formed by dry etching.

4. A method for forming a semiconductor device according to claim 1, wherein said second insulating film is formed of silicon nitride.

5. The method of claim 1, further comprising a step of forming a third conductive film on said substrate before said step of forming said first insulating film.

\* \* \* \* \*